US007772603B2

(12) United States Patent
Su et al.

(10) Patent No.: US 7,772,603 B2
(45) Date of Patent: Aug. 10, 2010

(54) ARRAY TYPE LIGHT-EMITTING DEVICE WITH HIGH COLOR RENDERING INDEX

(75) Inventors: Chih-Liang Su, Jhonghe (TW); Hsin-Chun Liu, Sanchong (TW); Fang-Po Wang, Yonghe (TW)

(73) Assignee: Ledtech Electronics Corp., Taipei County (TW)

( * ) Notice: Subject to any disclaimer, the term of this patent is extended or adjusted under 35 U.S.C. 154(b) by 413 days.

(21) Appl. No.: 12/000,684

(22) Filed: Dec. 17, 2007

(65) Prior Publication Data

US 2009/0152571 A1 Jun. 18, 2009

(51) Int. Cl.
*H01L 33/00* (2010.01)

(52) U.S. Cl. ............................ 257/89; 257/98; 257/99; 257/100; 257/E33.061

(58) Field of Classification Search .................. 257/88, 257/89, 98, 99, 100, E33.058, E33.061
See application file for complete search history.

(56) References Cited

U.S. PATENT DOCUMENTS 6,577,073 B2 * 6/2003 Shimizu et al. ............. 315/246
7,655,954 B2 * 2/2010 Su et al. ....................... 257/89

* cited by examiner

*Primary Examiner*—Minh-Loan T Tran
(74) *Attorney, Agent, or Firm*—Rosenberg, Klein & Lee

(57) ABSTRACT

An array type light-emitting device with high color rendering index includes: a substrate, an array type light-emitting module, a plurality of wavelength-converting layers, and a plurality of transparent layers. The array type light-emitting module is composed of a plurality of light-emitting chip rows, and each light-emitting chip row has a plurality of first light-emitting chips and at least one second light-emitting chip. The wavelength-converting layers are respectively covered on the first light-emitting chips. Therefore, a part of visible light emitted by the first light-emitting chips is absorbed and converted into visible light with another emission peak wavelength range via the wavelength-converting layers, and the visible light with another emission peak wavelength range mixes with projecting light projected from the second light-emitting chips to make the array type light-emitting device generate mixed white light with a color rendering index of between 90 and 95.

15 Claims, 9 Drawing Sheets

| | | | |
|---|---|---|---|
| B+P(OG) | B+P(OG) | B+P(OG) | B+P(OG) |
| B+P(G) | R+T | B+P(G) | R+T |
| R+T | B+P(G) | R+T | B+P(O) |
| B+P(G) | B+P(OG) | B+P(OG) | B+P(OG) |

| | | | |
|---|---|---|---|
| B+P(OG) | B+P(OG) | B+P(OG) | B+P(G) |
| R+T | B+P(G) | R+T | B+P(G) |
| B+P(G) | R+T | B+P(G) | R+T |
| B+P(G) | B+P(OG) | B+P(OG) | B+P(OG) |

| | | | |
|---|---|---|---|
| B+P(OG)' | B+P(OG)' | B+P(OG)' | B+P(G) |
| R+T | B+P(G) | R+T | B+P(G) |
| B+P(G) | R+T | B+P(G) | R+T |
| B+P(G) | B+P(OG)' | B+P(OG)' | B+P(OG)' |

ARRAY TYPE LIGHT-EMITTING DEVICE WITH HIGH COLOR RENDERING INDEX

BACKGROUND OF THE INVENTION

1. Field of the Invention

The present invention relates to a light-emitting device, and particularly relates to an array type light-emitting device with high color rendering index.

2. Description of the Related Art

LED (light emitting diode) is a semiconductor component. It has a small size, and its advantage is that it can efficiently generate colored light with a peak wavelength corresponding to a single color. If light of different colors emitted by many LEDs is mixed, a white light source can be obtained.

For example, three LEDs such as a red LED, a green LED and a blue LED, generating light of three different wavelengths in the visible range can be combined together. Because each LED is a light source with a distinct peak wavelength and a single color, the white light source resulting from mixing the three different wavelengths is always non-uniform.

It is a priority for designers to design a semiconductor light-emitting device with high color rendering index (CRI). However, the traditional mixing method of using many LEDs (such as red LED, green LED, blue LED) with different peak wavelengths to generate mixed white light can only obtain a color rendering index of about 80, and the generated white light is non-uniform.

SUMMARY OF THE INVENTION

One aspect of the present invention provides an array type light-emitting device with high color rendering index, including: a substrate, an array type light-emitting module, a plurality of wavelength-converting layers, and a plurality of transparent layers.

Moreover, the array type light-emitting module is electrically disposed on the substrate. The array type light-emitting module is composed of a plurality of light-emitting chip rows, and each light-emitting chip row has a plurality of first light-emitting chips with an emission wavelength range between 450 nm and 460 nm and at least one second light-emitting chip with an emission wavelength range between 620 nm and 640 nm.

Furthermore, the wavelength-converting layers are respectively covered on the first light-emitting chips. One part of the wavelength-converting layers is a mixture of green phosphor powders and a package colloid in order to generate projecting sources with an emission peak wavelength range between 520 nm and 540 nm from one part of the corresponding first light-emitting chips. Another part of the wavelength-converting layers is a mixture of yellow phosphor powders and a package colloid in order to generate projecting sources with a predetermined color temperature from another part of the corresponding first light-emitting chips. The transparent layers are respectively covered on the second light-emitting chips.

Therefore, a part of visible light emitted by the first light-emitting chips is absorbed and converted into visible light with another emission peak wavelength range via the wavelength-converting layers, and the visible light with another emission peak wavelength range mixes with projecting light projected from the second light-emitting chips to make the array type light-emitting emitting device generate mixed white light with a color rendering index of between 90 and 95.

It is to be understood that both the foregoing general description and the following detailed description are exemplary, and are intended to provide, further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIG. 7A is a spectrogram of a second array type light-emitting device with high color rendering index according to the first embodiment of the present invention;

FIG. 7B is a spectrogram of a second array type light-emitting device with high color rendering index according to the second embodiment of the present invention;

FIG. 7C is a spectrogram of a second array type light-emitting device with high color rendering index according to the third embodiment of the present invention.

DETAILED DESCRIPTION OF THE PREFERRED EMBODIMENTS

Figure 1:
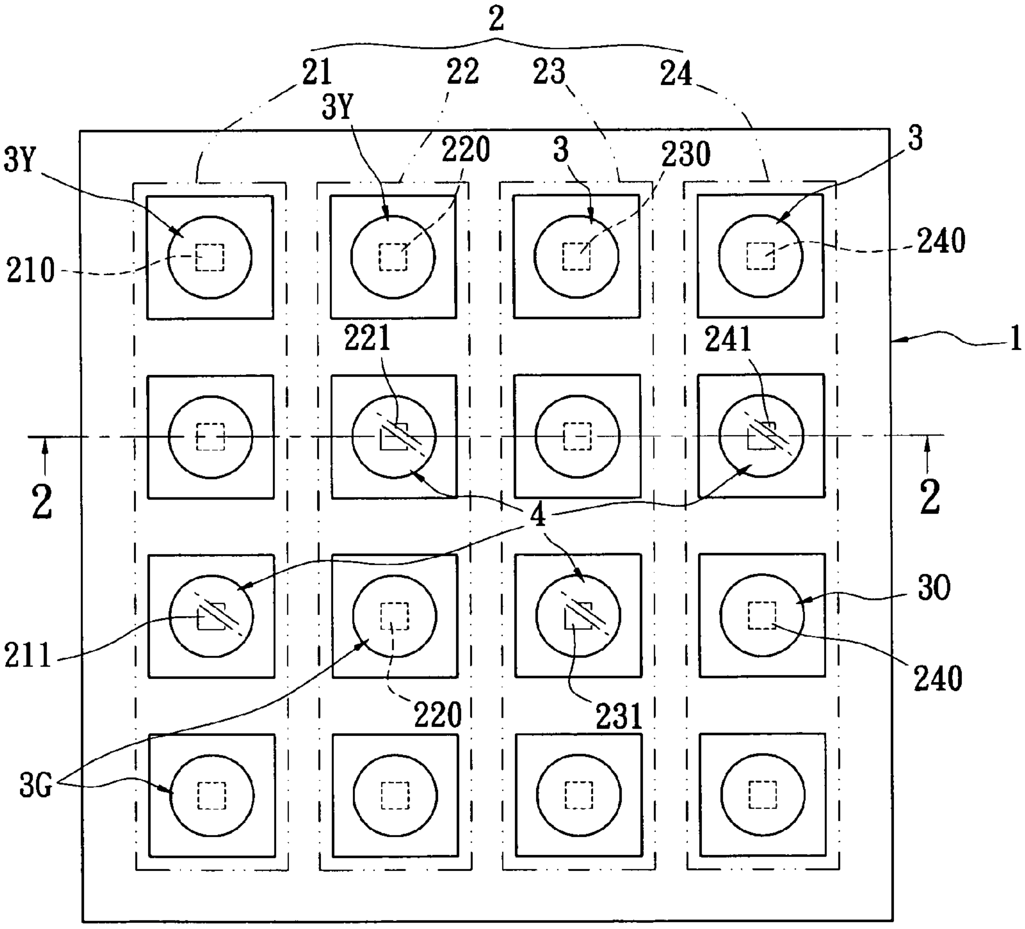
FIG. 1 is a top view of a first array type light-emitting device with high color rendering index according to the present invention.
Figure 2:
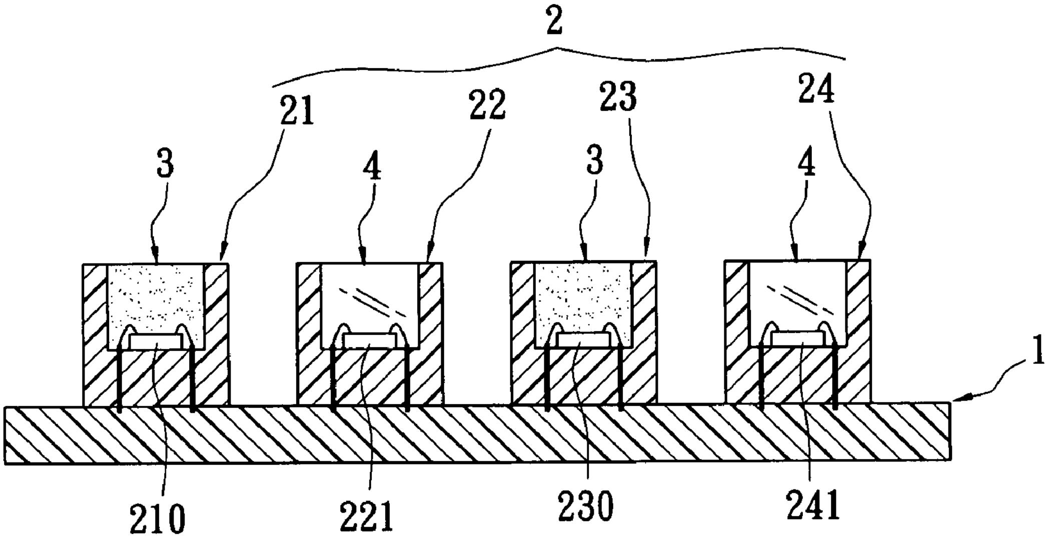
FIG. 2 is a cross-sectional view along line 2-2 in FIG. 1.

Referring to FIGS. 1-2, FIG. 1 shows a top view of a first array type light-emitting device with high color rendering index according to the present invention, and FIG. 2 shows a cross-sectional view along line 2-2 in FIG. 1. The present invention provides an array type light-emitting device with high color rendering index, including: a substrate 1, an array type light-emitting module 2, a plurality of wavelength-converting layers 3, and a plurality of transparent layers 4.

Moreover, the array type light-emitting module 2 is electrically disposed on the substrate 1. The array type light-emitting module 2 is composed of a plurality of light-emitting chip rows (21,22,23,24). Each light-emitting chip row has a plurality of first light-emitting chips with an emission wavelength range between 450 nm and 460 nm and at least one second light-emitting chip with an emission wavelength range between 620 nm and 640 nm.

AS shown in FIG. 1, the first light-emitting chip row 21 has three first light-emitting chips 210 and a second light-emitting chip 211. The second light-emitting chip row 22 has three first light-emitting chips 220 and a second light-emitting chip 221. The third light-emitting chip row 23 has three first light-emitting chips 230 and a second light-emitting chip 231. The fourth light-emitting chip row 24 has three first light-emitting chips 240 and a second light-emitting chip 241.

Moreover, the first light-emitting chips (210,220,230,240) can be blue LED chips, and the second light-emitting chips (211,221,231,241) can be red LED chips. In addition, the second light-emitting chips (211,221,231,241) are respectively and alternately arranged on different light-emitting chip rows (21,22,23,24), so the second light-emitting chips (211,221,231,241) are shown as a sawtooth shape. The first light-emitting chips (210,220,230,240) and the second light-emitting chips (211,221,231,241) are separated from each other by a predetermined distance.

Furthermore, the wavelength-converting layers 3 are respectively covered on the first light-emitting chips (210, 220,230,240). The transparent layers 4 are respectively covered on the second light-emitting chips (211,221,231,241).

One of the wavelength-converting layers 3 is a mixture 3O of orange phosphor powders and a package colloid, and light projected from one of the corresponding first light-emitting chip (such as the first light-emitting chip 240 of a third position of the fourth light-emitting chip row 24 in FIG. 1) is absorbed and converted into projected light with an emission peak wavelength range between 595 nm and 610 nm via the mixture 3O of orange phosphor powders and the package colloid.

One part of the wavelength-converting layers 3 is a mixture 3G of green phosphor powders and a package colloid, and light projected from one part of the corresponding first light-emitting chip (such as the first light-emitting chip 210 of a fourth position of the first light-emitting chip row 21 and the first light-emitting chip 220 of a three position of the second light-emitting chip row 22 in FIG. 1) is absorbed and converted into projected light with an emission peak wavelength range between 480 nm and 495 nm or between 520 nm and 540 nm via the mixture 3G of green phosphor powders and the package colloid.

Another part of the wavelength-converting layers 3 is a mixture 3Y of yellow phosphor powders and a package colloid, and light projected from another part of the corresponding first light-emitting chip (such as the first light-emitting chip 210 of a first position of the first light-emitting chip row 21 and the first light-emitting chip 220 of a first position of the second light-emitting chip row 22 in FIG. 1) is absorbed and converted into projected light with a predetermined color temperature between 2800K and 7000K or between 7000K and 1000K via the mixture 3Y of yellow phosphor powders and the package colloid. In addition, the yellow phosphor powders can be replaced by orange and green phosphor powders. Hence, light projected from another part of the corresponding first light-emitting chip is absorbed and converted into projected light with a predetermined color temperature via the mixture 3Y of orange and green phosphor powders and the package colloid Therefore, a part of visible light emitted by the first light-emitting chips (210,220,230,240) is absorbed and converted into visible light with another emission peak wavelength range via the wavelength-converting layers 3, and the visible light with another emission peak wavelength range mixes with projecting light projected from the second light-emitting chips (211,221,231,241) to make the array type light-emitting device generate mixed white light with a color rendering index of between 90 and 95.

However, abovementioned method of arranging the first light-emitting chips (210,220,230,240) and the second light-emitting chips (211,221,231,241) does not use to limit the present invention. For example, each light-emitting chip row (21, 22, 23 or 24) having at least one second light-emitting chip (211, 221, 231 or 241), and the wavelength-converting layers compounded from phosphor powders and a package colloid by different percentages and ingredients for respectively covering on the first light-emitting chips (210,220,230, 240) are protected in the present invention.

Figure 3:
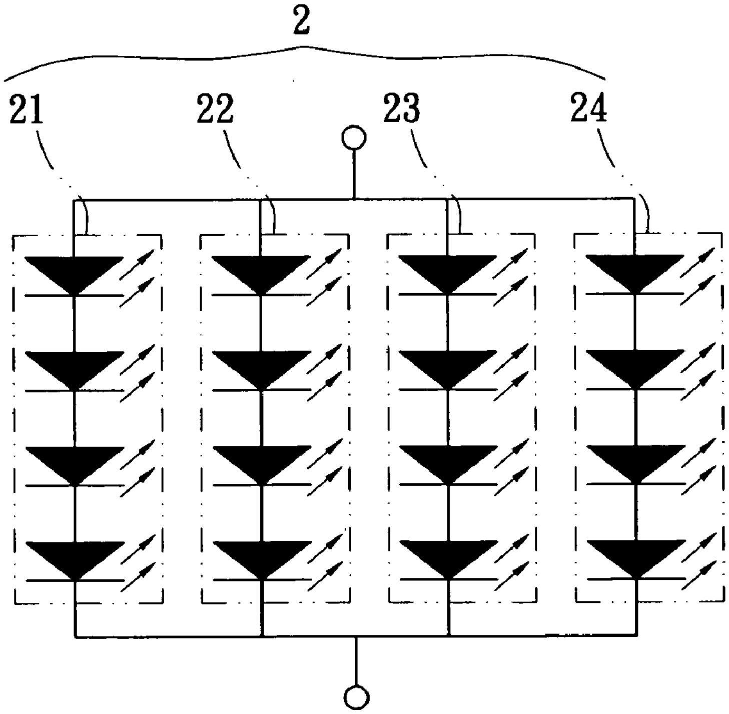
FIG. 3 is a schematic, circuit diagram of a first array type light-emitting device with high color rendering index according to the present invention.

FIG. 3 shows a schematic, circuit diagram of a first array type light-emitting device with high color rendering index according to the present invention. Referring to FIGS. 1 and 3, the array type light-emitting module 2 is composed of four light-emitting chip rows (21, 22, 23, 24), and each light-emitting chip row has three first light-emitting chips and one second light-emitting chip to form a 4×4 array light-emitting module. The light-emitting chip rows (21, 22, 23, 24) are electrically connected in parallel disposed on the substrate 1. The first light-emitting chips and the second light-emitting chip of each light-emitting chip row (21, 22, 23 or 24) are electrically connected in series disposed on the substrate 1.

Moreover, each first light-emitting chip has a voltage rating between 2.9 V and 4.0 V, and each second light-emitting chip has a voltage rating between 1.8 V and 2.8 V. According to different needs, the designer can choose any first and second light-emitting chips with different voltages to make a total voltage of each light-emitting chip row (21, 22, 23 or 24) be approximately 12 V. In the best mode embodiment of the present the total voltage of each light-emitting chip row (21, 22, 23 or 24) is 12 V.

Figure 4A:
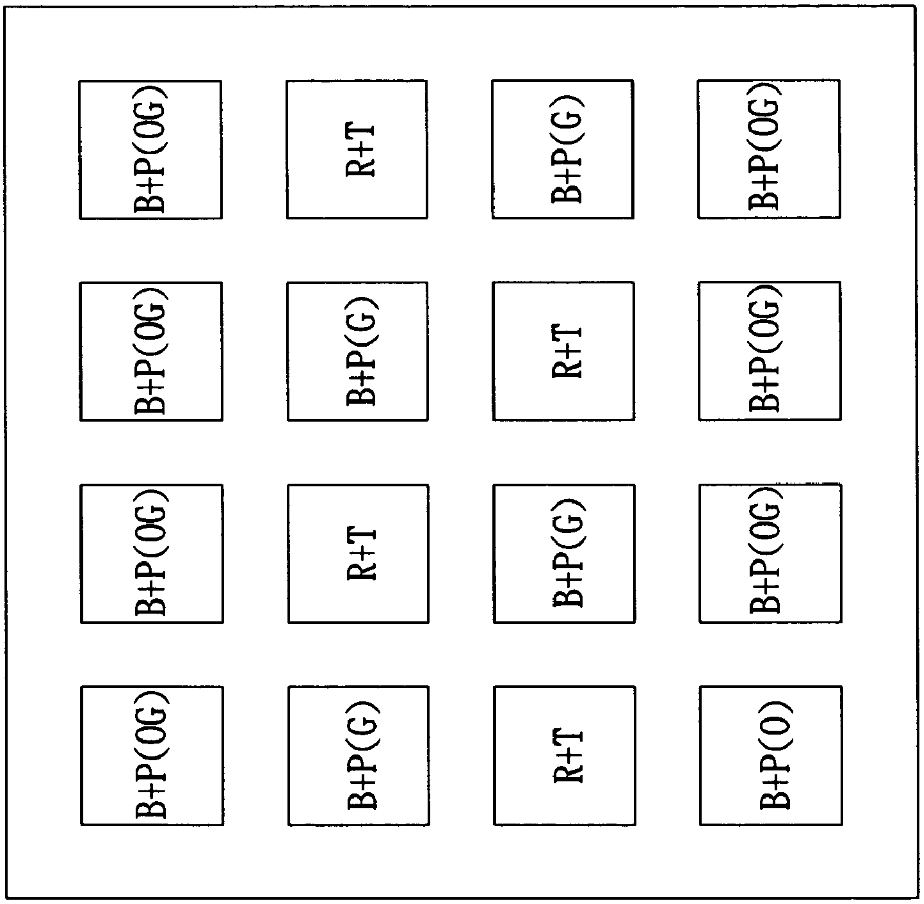
FIG. 4*a* is a schematic view of an arrangement of a first array type light-emitting device with high color rendering index according to the first embodiment of the present invention.

FIG. 4*a* shows a schematic view of an arrangement of a first array type light-emitting device with high color rendering index according to the first embodiment of the present invention. The description of the first array type light-emitting device of the first embodiment is as follows:

The area of B+P(OG) means that a blue LED chip B mates with a mixture P(OG) of orange and green phosphor powders and a package colloid, and a part of visible light emitted by the blue LED chip B is absorbed and converted into a white projecting light source with a color temperature range between 2800K and 7000K via the mixture P(OG);

The area of B+P(G) means that a blue LED chip B mates with a mixture P(G) of green phosphor powders and a package colloid, and a part of visible light emitted by the blue LED chip B is absorbed and converted into a green projecting light source with an emission peak wavelength range between 520 nm and 540 nm;

The area of B+P(O) means that a blue LED chip B mates with a mixture P(O) of orange phosphor powders and a package colloid, and a part of visible light emitted by the blue LED chip B is absorbed and converted into an orange projecting light source with an emission peak wavelength range between 595 nm and 610 nm; and The area of R+T means that a red LED chip R directly passes through a transparent layer T to generate a red projecting light source with an emission wavelength range between 620 nm and 640 nm.

Therefore, a part of visible light emitted by the blue LED chips B is absorbed and converted into visible light with another emission peak wavelength range via the wavelength-converting layers (P(OG), P(G), P(O)), and the visible light with another emission peak wavelength range mixes with projecting light projected from the red LED chips R to make the first array type light-emitting device of the first embodiment generate mixed white light with a color temperature range between 2500K and 4000K.

Figure 4B:
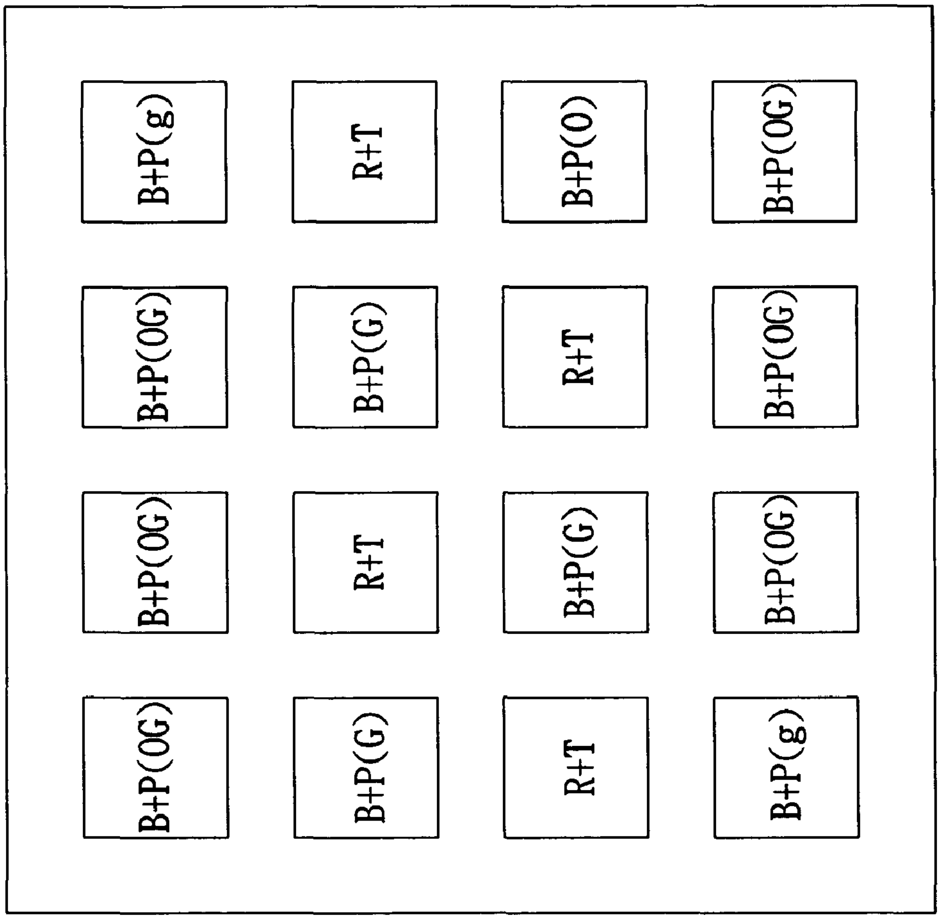
FIG. 4*b* is a schematic view of an arrangement of a first array type light-emitting device with high color rendering index according to the second embodiment of the present invention.

FIG. 4*b* shows a schematic view of an arrangement of a first array type light-emitting device with high color rendering index according to the second embodiment of the present invention. The description of the first array type light-emitting device of the second embodiment is as follows:

The area of B+P(OG) means that a blue LED chip B mates with a mixture P(OG) of orange and green phosphor powders and a package colloid, and a part of visible light emitted by the blue LED chip B is absorbed and converted into a white projecting light source with a color temperature range between 2800K and 7000K via the mixture P(OG);

The area of B+P(G) means that a blue LED chip B mates with a mixture P(G) of green phosphor powders and a package colloid, and a part of visible light emitted by the blue LED chip B is absorbed and converted into a green projecting light source with an emission peak wavelength range between 520 nm and 540 nm;

The area of B+P(g) means that a blue LED chip B mates with a mixture P(g) of green phosphor powders and a package colloid, and a part of visible light emitted by the blue LED chip B is absorbed and converted into a green projecting light source with an emission peak wavelength range between 480 nm and 495 nm;

The area of B+P(O) means that a blue LED chip B mates with a mixture P(O) of orange phosphor powders and a package colloid, and a part of visible light emitted by the blue LED chip B is absorbed and converted into an organ projecting light source with an emission peak wavelength range between 595 nm and 610 nm; and The area of R+T means that a red LED chip R directly passes through a transparent layer T to generate a red projecting light source with an emission wavelength range between 620 nm and 640 nm.

Therefore, a part of visible light emitted by the blue LED chips B is absorbed and converted into visible light with another emission peak wavelength range via the wavelength-converting layers (P(OG), P(G), P(g), P(O)), and the visible light with another emission peak wavelength range mixes with projecting light projected from the red LED chips R to make the first array type light-emitting device of the second embodiment generate mixed white light with a color temperature range between 4000K and 6000K.

Figure 4C:
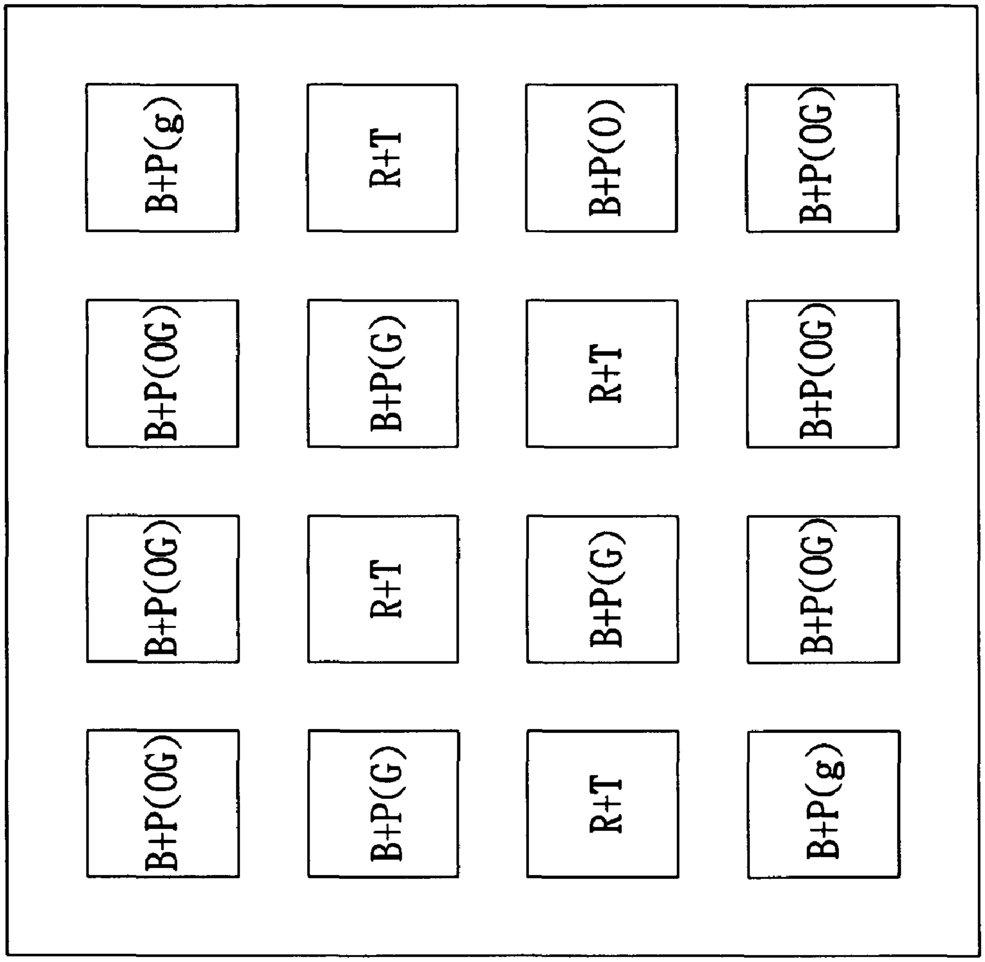
FIG. 4*c* is a schematic view of an arrangement of a first array type light-emitting device with high color rendering index according to the third embodiment of the present invention.

FIG. 4*c* shows a schematic view of an arrangement of a first array type light-emitting device with high color rendering index according to the third embodiment of the present invention. The description of the first array type light-emitting device of the third embodiment is as follows:

The area of B+P(OG) means that a blue LED chip B mates with a mixture P(OG) of orange and green phosphor powders and a package colloid, and a part of visible light emitted by the blue LED chip B is absorbed and converted into a white projecting light source with a color temperature range between 7000K and 11,000K via the mixture P(OG);

The area of B+P(G) means that a blue LED chip B mates with a mixture P(G) of green phosphor powders and a package colloid, and a part of visible light emitted by the blue LED chip B is absorbed and converted into a green projecting light source with an emission peak wavelength range between 520 nm and 540 nm;

The area of B+P(g) means that a blue LED chip B mates with a mixture P(g) of green phosphor powders and a package colloid, and a part of visible light emitted by the blue LED chip B is absorbed and converted into a green projecting light source with an emission peak wavelength range between 480 nm and 495 nm;

The area of B+P(O) means that a blue LED chip B mates with a mixture P(O) of orange phosphor powders and a package colloid, and a part of visible light emitted by the blue LED chip B is absorbed and converted into an organ projecting light source with an emission peak wavelength range between 595 nm and 610 nm; and The area of R+T means that a red LED chip R directly passes through a transparent layer T to generate a red projecting light source with an emission wavelength range between 620 nm and 640 nm.

Therefore, a part of visible light emitted by the blue LED chips B is absorbed and converted into visible light with another emission peak wavelength range via the wavelength-converting layers (P(OG), P(G), P(g), P(O)), and the visible light with another emission peak wavelength range mixes with projecting light projected from the red LED chips R to make the first array type light-emitting device of the third embodiment generate mixed white light with a color temperature range between 6000K and 9000K.

Figure 5:
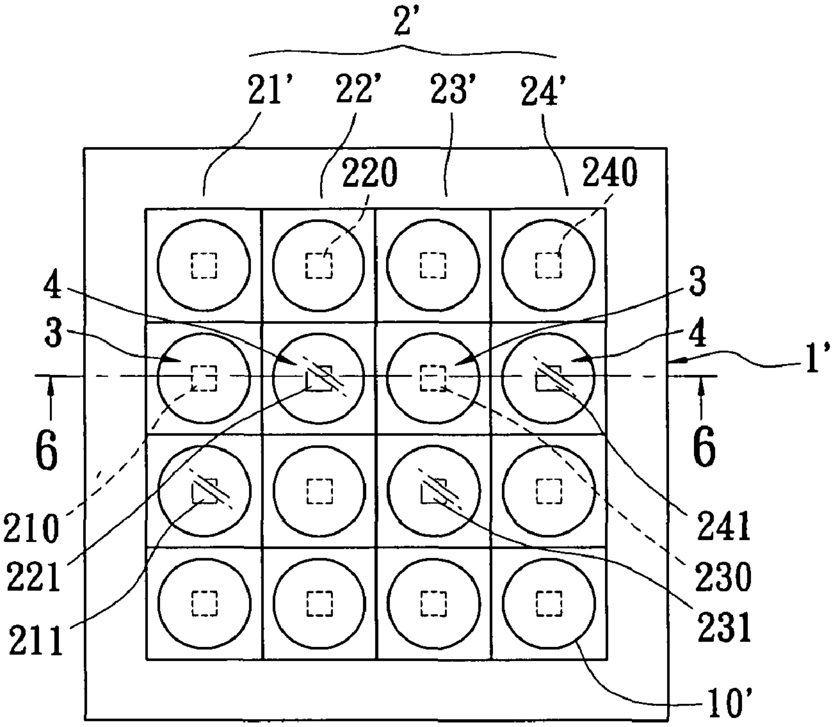
FIG. 5 is a top view of a second array type light-emitting device with high color rendering index according to the present invention.
Figure 6:
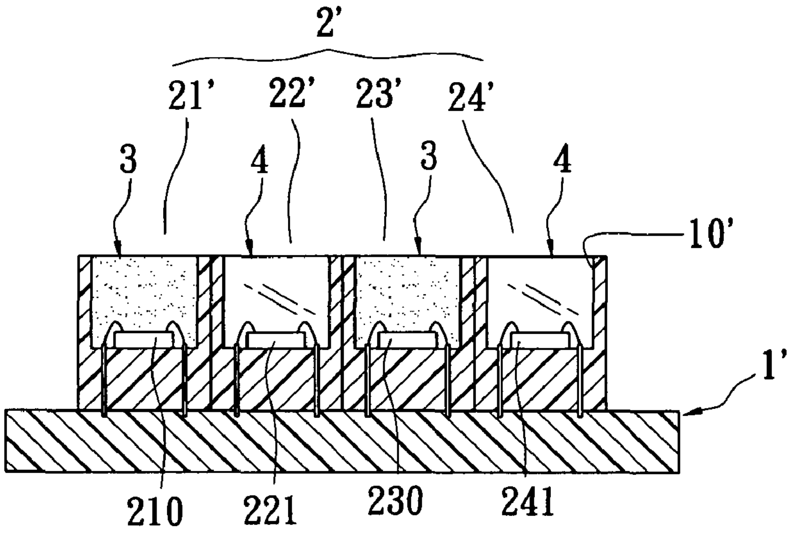
FIG. 6 is a cross-sectional view along line 6-6 in FIG. 5.

Referring to FIGS. 5 and 6, FIG. 5 shows a top view of a second array type light-emitting device with high color rendering index according to the present invention, and FIG. 6 shows a cross-sectional view along line 6-6 in FIG. 5. The difference between the second type of the array type light-emitting device and the first type of the array type light-emitting device is that a substrate 1' has a plurality of receiving grooves 10' abutting against each other, and the first light-emitting chips (210,220,230,240) and the second light-emitting chips (211,221,231,241) of light-emitting chip rows (21', 22', 23', 24') of an array type light-emitting module 2' are respectively received in the receiving grooves 10'.

Figure 7A:
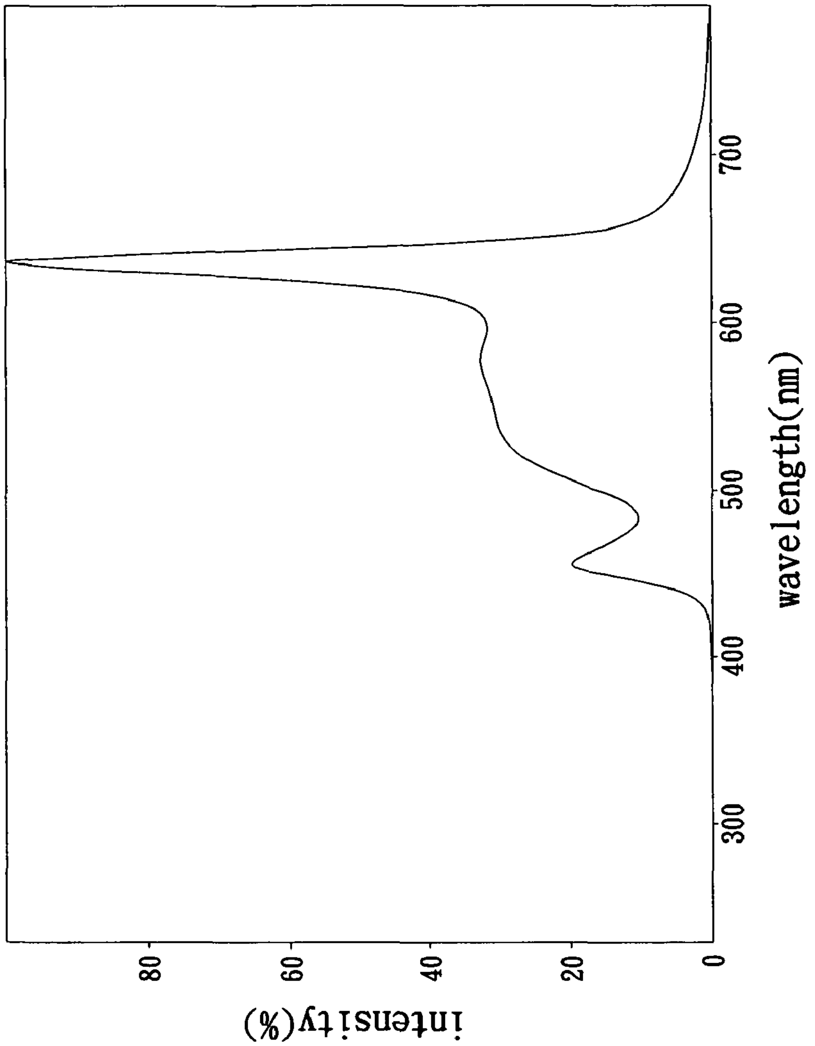
FIG. 7*a* is a schematic view of an arrangement of a second array type light-emitting device with high color rendering index according to the first embodiment of the present invention.

Referring to FIGS. 7*a* and 7A, FIG. 7*a* shows a schematic view of an arrangement of a second array type light-emitting device with high color rendering index according to the first embodiment of the present invention, and FIG. 7A shows a spectrogram of a second array type light-emitting device with high color rendering index according to the first embodiment of the present invention. The description of the second array type light-emitting device of the first embodiment is as follows:

The area of B+P(OG) means that a blue LED chip B mates with a mixture P(OG) of orange and green phosphor powders and a package colloid, and a part of visible light emitted by the blue LED chip B is absorbed and converted into a white projecting light source with a color temperature range between 2800K and 7000K via the mixture P(OG);

The area of B+P(G) means that a blue LED chip B mates with a mixture P(G) of green phosphor powders and a package colloid, and a part of visible light emitted by the blue LED chip B is absorbed and converted into a green projecting light source with an emission peak wavelength range between 520 nm and 540 nm;

The area of B+P(O) means that a blue LED chip B mates with a mixture P(O) of orange phosphor powders and a package colloid, and a part of visible light emitted by the blue LED chip B is absorbed and converted into an orange projecting light source with an emission peak wavelength range between 595 nm and 610 nm; and The area of R+T means that a red LED chip R directly passes through a transparent layer T to generate a red projecting light source with an emission wavelength range between 620 nm and 640 nm.

Therefore, a part of visible light emitted by the blue LED chips B is absorbed and converted into visible light with another emission peak wavelength range via the wavelength-converting layers (P(OG), P(G), P(O)), and the visible light with another emission peak wavelength range mixes with projecting light projected from the red LED chips R to make the first array type light-emitting device of the first embodiment generate mixed white light with a high color rendering index (CRI) of 93.16 and a color temperature range between 2500K and 4000K as shown in FIG. 7A.

Figure 7B:
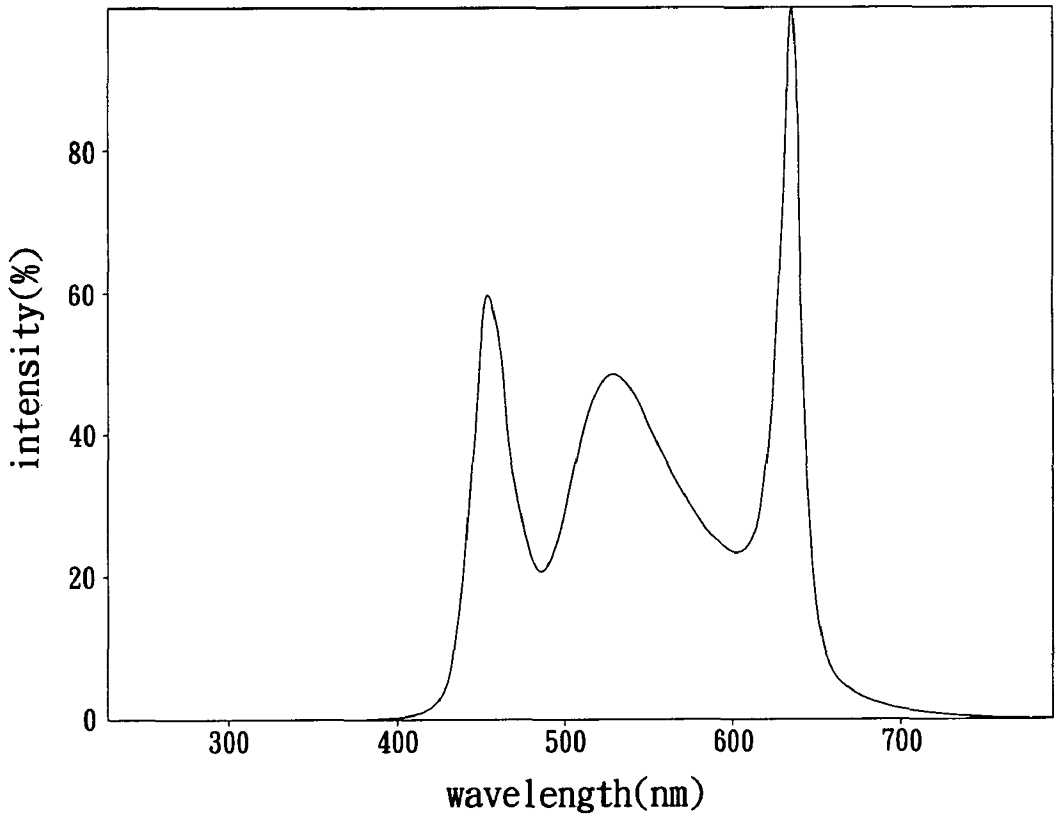
FIG. 7*b* is a schematic view of an arrangement of a second array type light-emitting device with high color rendering index according to the second embodiment of the present invention.

Referring to FIGS. 7*b* and 7B, FIG. 7*b* shows a schematic view of an arrangement of a second array type light-emitting device with high color rendering index according to the second embodiment of the present invention, and FIG. 7B shows a spectrogram of a second array type light-emitting device with high color rendering index according to the second embodiment of the present invention. The description of the second array type light-emitting device of the second embodiment is as follows:

The area of B+P(OG) means that a blue LED chip B mates with a mixture P(OG) of orange and green phosphor powders and a package colloid, and a part of visible light emitted by the blue LED chip B is absorbed and converted into a white projecting light source with a color temperature range between 2800K and 7000K via the mixture P(OG);

The area of B+P(G) means that a blue LED chip B mates with a mixture P(G) of green phosphor powders and a package colloid, and a part of visible light emitted by the blue LED chip B is absorbed and converted into a green projecting light source with an emission peak wavelength range between 520 nm and 540 nm; and The area of R+T means that a red LED chip R directly passes through a transparent layer T to generate a red projecting light source with an emission wavelength range between 620 nm and 640 nm.

Therefore, a part of visible light emitted by the blue LED chips B is absorbed and converted into visible light with another emission peak wavelength range via the wavelength-converting layers (P(OG), P(G)), and the visible light with another emission peak wavelength range mixes with projecting light projected from the red LED chips R to make the first array type light-emitting device of the second embodiment generate mixed white light with a high color rendering index (CRI) of 90.46 and a color temperature range between 4000K and 6000K as shown in FIG. 7B.

Figure 7C:
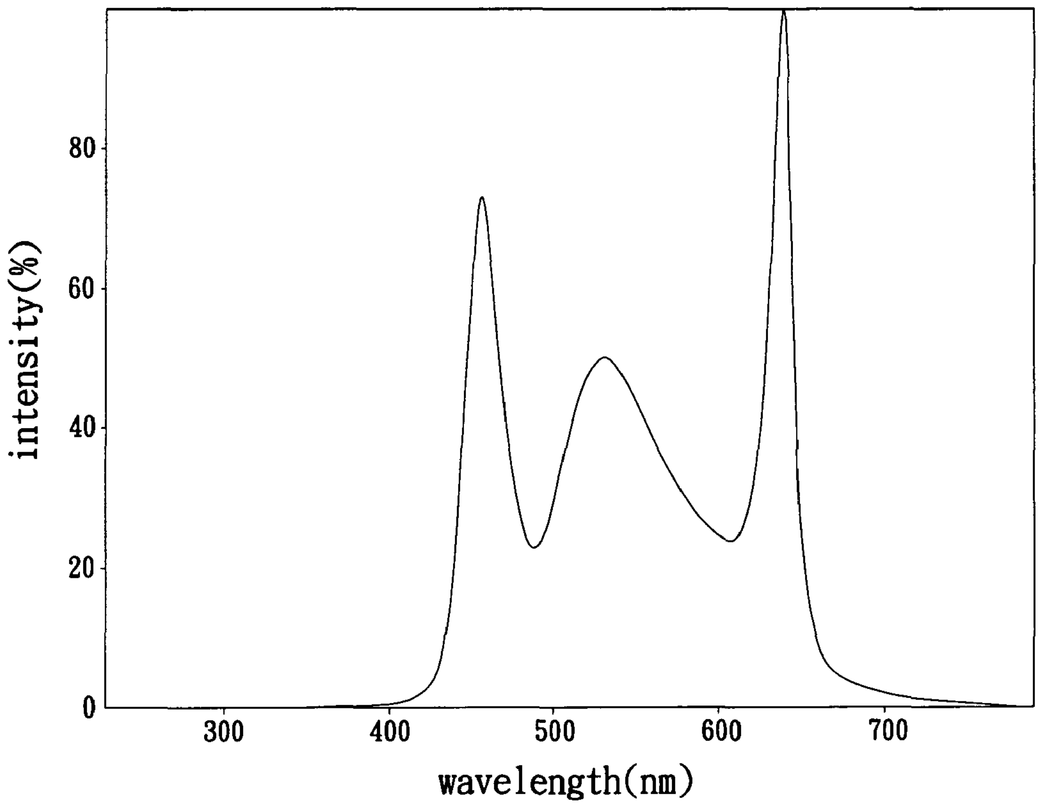
FIG. 7*c* is a schematic view of an arrangement of a second array type light-emitting device with high color rendering index according to the third embodiment of the present invention.

Referring to FIGS. 7*c* and 7C, FIG. 7*c* shows a schematic view of an arrangement of a second array type light-emitting device with high color rendering index according to the third embodiment of the present invention, and FIG. 7C shows a spectrogram of a second array type light-emitting device with high color rendering index according to the third embodiment of the present invention. The description of the second array type light-emitting device of the third embodiment is as follows:

The area of B+P(OG)' means that a blue LED chip B mates with a mixture P(OG)' of orange and green phosphor powders and a package colloid, and a part of visible light emitted by the blue LED chip B is absorbed and converted into a white projecting light source with a color temperature range between 7000 K and 11,000 K via the mixture P(OG)';

The area of B+P(G) means that a blue LED chip B mates with a mixture P(G) of green phosphor powders and a package colloid, and a part of visible light emitted by the blue LED chip B is absorbed and converted into a green projecting light source with an emission peak wavelength range between 520 nm and 540 nm; and The area of R+T means that a red LED chip R directly passes through a transparent layer T to generate a red projecting light source with an emission wavelength range between 620 nm and 640 nm.

Therefore, a part of visible light emitted by the blue LED chips B is absorbed and converted into visible light with another emission peak wavelength range via the wavelength-converting layers (P(OG)', P(G)), and the visible light with another emission peak wavelength range mixes with projecting light projected from the red LED chips R to make the first array type light-emitting device of the second embodiment generate mixed white light with a high color rendering index (CRI) of 90.18 and a color temperature range between 6000K and 9000K as shown in FIG. 7C.

In conclusion, the present invention has some features as follows: each light-emitting chip row has a plurality of first light-emitting chips and at least one second light-emitting chip. Furthermore, one part of the wavelength-converting layers is a mixture of green phosphor powders and a package colloid in order to generate projecting sources with an emission peak wavelength range between 520 nm and 540 nm from one part of the corresponding first light-emitting chips. Another part of the wavelength-converting layers is a mixture of yellow phosphor powders (or orange and green phosphor powders) and a package colloid in order to generate projecting sources with a predetermined color temperature from another part of the corresponding first light-emitting chips. The second light-emitting chips are respectively and alternately arranged on different light-emitting chip rows. Therefore, the array type light-emitting device generates white light with a color rendering index of between 90 and 95.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An array type light-emitting device with high color rendering index, comprising:

a substrate;

an array type light-emitting module electrically disposed on the substrate, wherein the array type light-emitting module is composed of a plurality of light-emitting chip rows, and each light-emitting chip row has a plurality of first light-emitting chips with an emission wavelength range between 450 nm and 460 nm and at least one second light-emitting chip with an emission wavelength range between 620 nm and 640 nm;

a plurality of wavelength-converting layers respectively covered on the first light-emitting chips, wherein one part of the wavelength-converting layers is a mixture of green phosphor powders and a package colloid in order to generate projecting sources with an emission peak wavelength range between 520 nm and 540 nm from one part of the corresponding first light-emitting chips, and another part of the wavelength-converting layers is a mixture of yellow phosphor powders and a package colloid in order to generate projecting sources with a predetermined color temperature from another part of the corresponding first light-emitting chips; and a plurality of transparent layers respectively covered on the second light-emitting chips;

whereby, a part of visible light emitted by the first light-emitting chips is absorbed and converted into visible light with another emission peak wavelength range via the wavelength-converting layers, and the visible light with another emission peak wavelength range mixes with projecting light projected from the second light-emitting chips to make the array type light-emitting device generate mixed white light with a color rendering index of between 90 and 95.

2. The array type light-emitting device as claimed in claim 1, wherein each first light-emitting chip is a blue LED chip, and each second light-emitting chip is a red LED chip.

3. The array type light-emitting device as claimed in claim 1, wherein the second light-emitting chips are respectively and alternately arranged on different light-emitting chip rows.

4. The array type light-emitting device as claimed in claim 1, wherein the predetermined color temperature of the projecting sources is between 2800K and 11,000K.

5. The array type light-emitting device as claimed in claim 1, wherein the yellow phosphor powders is compounded from orange phosphor powders and green phosphor powers.

6. The array type light-emitting device as claimed in claim 1, wherein one of the wavelength-converting layers is a mixture of orange phosphor powders and a package colloid, and light projected from one of the corresponding first light-emitting chip is absorbed and converted into projected light with an emission peak wavelength range between 595 nm and 610 nm via the mixture of orange phosphor powders and the package colloid.

7. The array type light-emitting device as claimed in claim 1, wherein another part of the wavelength-converting layers is a mixture of green phosphor powders and a package colloid, and light projected from another part of the corresponding first light-emitting chip is absorbed and converted into projected light with an emission peak wavelength range between 480 nm and 495 nm via the mixture of green phosphor powders and the package colloid.

8. The array type light-emitting device as claimed in claim 1, wherein the wavelength-converting layers are compounded from phosphor powders and a package colloid by different percentages and ingredients.

9. The array type light-emitting device as claimed in claim 1, wherein the light-emitting chip rows are electrically connected in parallel disposed on the substrate.

10. The array type light-emitting device as claimed in claim 1, wherein the first light-emitting chips and the second light-emitting chip of each light-emitting chip row are electrically connected in series disposed on the substrate.

11. The array type light-emitting device as claimed in claim 1, wherein the array type light-emitting module is composed of four light-emitting chip rows, and each light-emitting chip row has three first light-emitting chips and one second light-emitting chip to form a 4×4 array light-emitting module.

12. The array type light-emitting device as claimed in claim 1, wherein each first light-emitting chip has a voltage rating between 2.9 V and 4.0 V, and each second light-emitting chip has a voltage rating between 1.8 V and 2.8 V.

13. The array type light-emitting device as claimed in claim 1, wherein a total voltage of each light-emitting chip row is 12 V.

14. The array type light-emitting device as claimed in claim 1, wherein the first light-emitting chips and the second light-emitting chips are separated from each other by a predetermined distance.

15. The array type light-emitting device as claimed in claim 1, wherein the substrate has a plurality of receiving grooves abutting against each other, and the first light-emitting chips and the second light-emitting chips are respectively received in the receiving grooves.

* * * * *